United States Patent
Correa et al.

(10) Patent No.: US 9,007,125 B2
(45) Date of Patent: Apr. 14, 2015

(54) RF POWER AMPLIFIER AND METHOD OF ASSEMBLY FOR SAME

(71) Applicant: Empower RF Systems, Inc., Inglewood, CA (US)

(72) Inventors: Paulo Correa, Dana Point, CA (US); Donald M. Wike, Corona, CA (US); Leonid Mogilevsky, Encino, CA (US)

(73) Assignee: Empower RF Systems, Inc., Inglewood, CA (US)

( * ) Notice: Subject to any disclaimer, the term of this patent is extended or adjusted under 35 U.S.C. 154(b) by 48 days.

(21) Appl. No.: 13/773,403

(22) Filed: Feb. 21, 2013

(65) Prior Publication Data

US 2014/0232469 A1  Aug. 21, 2014

(51) Int. Cl.
*H03F 1/00* (2006.01)
*H03F 3/21* (2006.01)

(52) U.S. Cl.
CPC ........................................ *H03F 3/211* (2013.01)

(58) Field of Classification Search
USPC ......................................... 330/65, 66, 67, 68
See application file for complete search history.

(56) References Cited

U.S. PATENT DOCUMENTS 5,546,273 A * 8/1996 Harris ............................ 361/697
6,542,035 B2 * 4/2003 Cook et al. ..................... 330/286

* cited by examiner

*Primary Examiner* — Steven J Mottola
(74) *Attorney, Agent, or Firm* — Wilmer Cutler Pickering Hale and Dorr LLP

(57) ABSTRACT

In general, an RF power amplifier comprises a controller, a driver, a splitter, a final stage, and a combiner coupled together to function as the RF power amplifier. One or more of the above components are arranged on one or more motherboards, e.g., a printed circuit board (PCB). A heat sink defines a base of the RF power amplifier, and in some embodiments includes at least two grooves formed therein, wherein the electrical components of the splitter and electrical components of the controller fit within one or more of the grooves so that these components can substantially disposed within the heat sink. In some embodiments, a power rail is also provided, and is also disposed substantially within the heat sink. The power rail groove of the heat sink and the carrier of the final stage provide an EMI shield of the power rail.

21 Claims, 13 Drawing Sheets

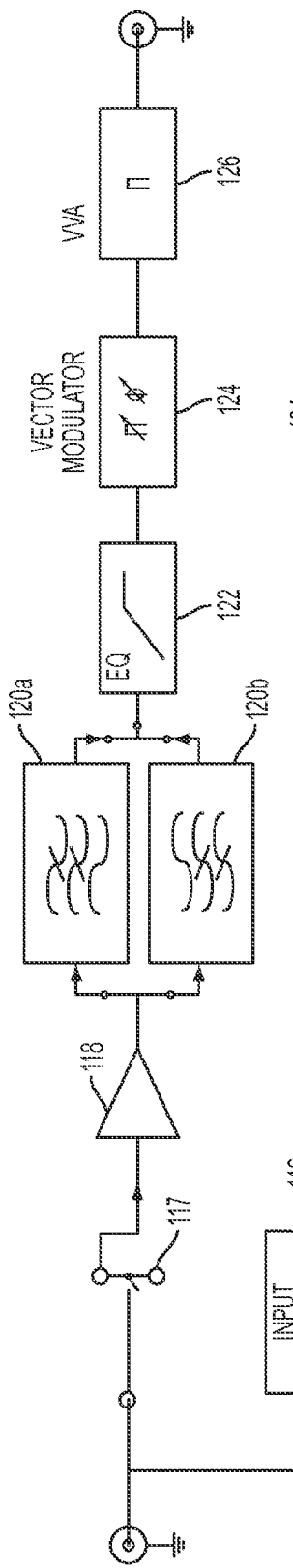
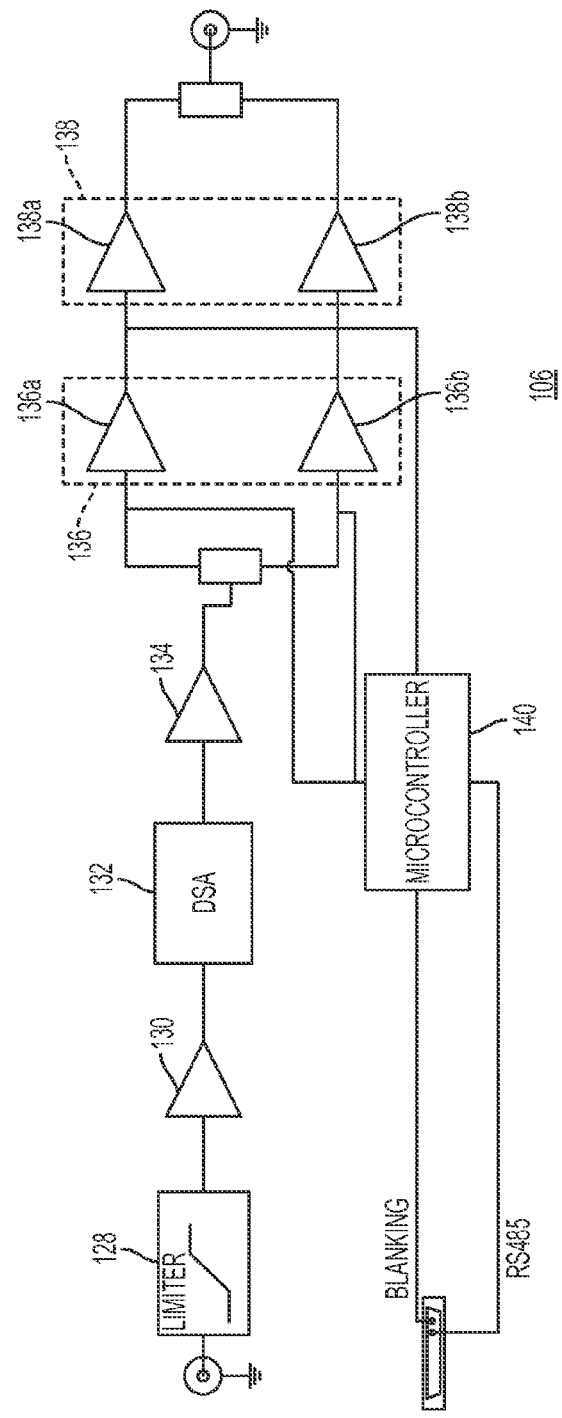
FIG. 1C
FIG. 1D

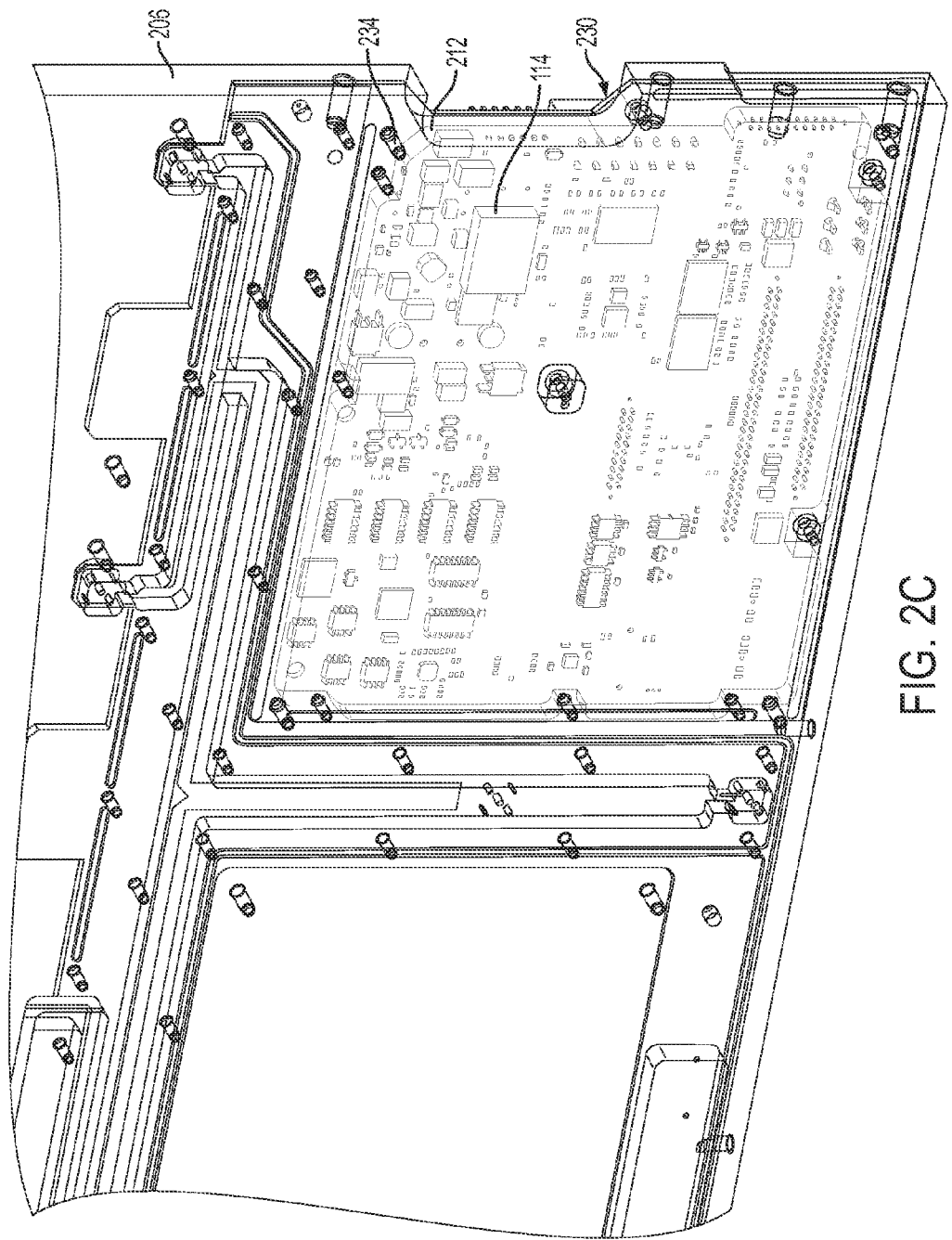

RF POWER AMPLIFIER AND METHOD OF ASSEMBLY FOR SAME

FIELD OF THE INVENTION

This invention relates generally to the field of RF power amplifiers and more particularly to an architecture for an RF power amplifier. This invention also relates generally to the field of combiners for RF power amplifiers.

BACKGROUND

An RF power amplifier is a type of electronic amplifier used to convert a low-power radio-frequency signal into a larger signal of significant power, typically for driving the antenna of a transmitter. It is usually optimized to have high efficiency and high output power, while minimizing heat dissipation. The basic RF amplifier apparatus includes an input circuit, a splitter, a final stage and a combiner that operate together to deliver the amplified output.

Existing RF amplifiers have problems. The RF amplifier assembly described above is difficult to manufacture, involves multiple assembly steps, and the assembly process is error prone. For example, each of the input signal circuit, splitter, modules of the final stage and combiner can be assembled on different printed circuit boards (PCBs). As such, wiring has to connect the circuitry together for the amplifier to operate. The circuitry and wiring of the RF amplifier can generate EMI that can affect the operation of the various electronic components of the circuit. Accordingly, the circuitry and wiring must be shielded and laid out on the circuit board in such a way so as to reduce RF and spurious emissions. Traditionally, this wiring is shielded by using a sheathed cabling to connect the various electronic components. However, the use of cabling creates significant routing and assembly issues and is difficult to implement. For example, the cabling can make the various solder connections difficult and time-consuming to implement. Moreover, the cabling and layout of the cabling for the traditional power amplifier has the potential to increase power losses on the wiring, reducing the overall efficiency of the power amplifier.

In addition to the wiring issues, a heat sink must also be provided in the amplifier to dissipate the heat generated by the electronic components and wiring. The heat sink must be disposed to maximize the dissipation of heat generated by the electronics, while exposing the electronic components so that they can also receive EMI shielding. To do this, multiple layers are used to provide the heat sink and EMI shield. Because the devices can be highly irregular, each electronic component could have its own heat sink, printed circuit board and EMI shield, increasing the number of components in the assembly, and creating more wiring issues.

Embodiments of the present invention attempt to resolve these issues and issues relating to combiners for RF power amplifiers.

SUMMARY OF INVENTION

In accordance with the disclosed subject matter, various RF power amplifier architectures are disclosed.

One embodiment of the invention is an RF power amplifier that comprises a controller, a driver, a splitter, a final stage, and a combiner coupled together to function as the RF power amplifier. One or more of the above components are arranged on one or more motherboards, e.g., a printed circuit board (PCB). A heat sink defines a base of the RF power amplifier, and in some embodiments the base includes at least two grooves formed therein, wherein the electrical components of the splitter and electrical components of the controller fit within one or more of the grooves so that these components can be substantially disposed within the heat sink. In some embodiments, a power rail is also provided, and is also disposed substantially within the heat sink. The power rail groove of the heat sink and the carrier of the final stage provide an EMI shield of the power rail.

Other embodiments of the invention include an RF power amplifier architecture that comprises a motherboard printed circuit board (PCB), the motherboard PCB including electrical components for at least a splitter of the RF power amplifier; and a heat sink defining a base of the RF power amplifier, the heat sink including a groove. In some embodiments, the electrical components of the splitter and electrical components of a controller fit within the groove, and the heat sink serves as an EMI shield for RF and spurious emissions. In some embodiments, the RF power amplifier architecture is scalable and configurable without substantial design changes for RF power amplifiers over a range of frequencies and power levels.

Another embodiment of the invention is a combiner for an RF amplifier. The combiner can include a ferrite core for low frequency operation, where the ferrite core has a hole defined therein. The combiner also includes a coaxial cable and a stripline. The coaxial cable is dimensioned to the highest operating frequency of the RF amplifier, and the coaxial cable has a first dielectric constant, wherein the coaxial cable connects an RF output of at least two final stages in parallel to the output of the RF amplifier, and the coaxial cable is routed through the hole of the ferrite core. The stripline has a second dielectric constant, and the stripline connects the RF output of the at least two final stages in parallel to the output of the RF amplifier. The stripline is routed around the ferrite core. In this embodiment, the electrical length of the stripline is matched to the electrical length of the coaxial cable, where the electrical length of the coaxial cable is defined by the first dielectric constant and the electrical length of the stripline is defined by the second dielectric constant. Another embodiment is a method for assembling a combiner for an RF amplifier, where the combiner has the features set forth above.

BRIEF DESCRIPTION OF THE DRAWING

So that the features and advantages of the invention may be understood in more detail, a more particular description of the invention briefly summarized above may be had by reference to the appended drawings, which form a part of this specification. It is to be noted, however, that the drawings illustrate only various embodiments of the invention and are therefore not to be considered limiting of the invention's scope as it may include other effective embodiments as well.

FIG. 1C is a block diagram of a small signal input circuit according to an embodiment of the invention;

FIG. 1D is a block diagram of a driver amplifier according to an embodiment of the invention;

FIG. 2C is a partially transparent top plan view of the PCB disposed on the heat sink and EMF shield according to an embodiment of the invention;

DETAILED DESCRIPTION

Although the invention has been described and illustrated in the foregoing illustrative embodiments, it is understood that the present disclosure has been made only by way of example, and that numerous changes in the details of implementation of the invention can be made without departing from the spirit and scope of the invention. Features of the disclosed embodiments can be combined and rearranged in various ways.

In general, an RF power amplifier comprises a controller, a driver, a splitter, a final stage, and a combiner coupled together to function as the RF power amplifier. One or more of the above components are arranged on one or more motherboards, e.g., a printed circuit board (PCB). However, in a preferred embodiment, the motherboard includes electrical components for at least the splitter. In other embodiments, the motherboard may include the controller and splitter, and in some other embodiments the controller and splitter may be disposed on separate printed circuit boards.

According to some embodiments of the invention, a heat sink defines a base of the RF power amplifier and includes at least two grooves formed therein, wherein the electrical components of the splitter and electrical components of the controller fit within one or more of the grooves so that these components are substantially disposed within the heat sink. In some embodiments, a power rail is also provided, and is also disposed substantially within a groove in the heat sink, to distribute a DC voltage to the final stage and various amplifier modules comprising the final stage. In this arrangement, the heat sink serves as an EMI shield for RF and spurious emissions from the electrical components of the RF amplifier, and it also dissipates heat from the electrical components of the splitter and the electrical components of the controller. The heat sink and the carrier of the final stage can also act as an EMI shield of the power rail.

According to other embodiments of the invention, a combiner for the RF amplifier includes a ferrite core, a coaxial cable extending through a hole in the ferrite core, and a stripline disposed around the ferrite core. A wiring layer connects the outputs from the final stage to the input to the combiner. The coaxial cable and the stripline have different mechanical lengths, but have the same electrical lengths, because the relative permittivity (also referred to herein as the dielectric constant) of the coaxial cable and the relative permittivity of the stripline differ.

Figure 1A:
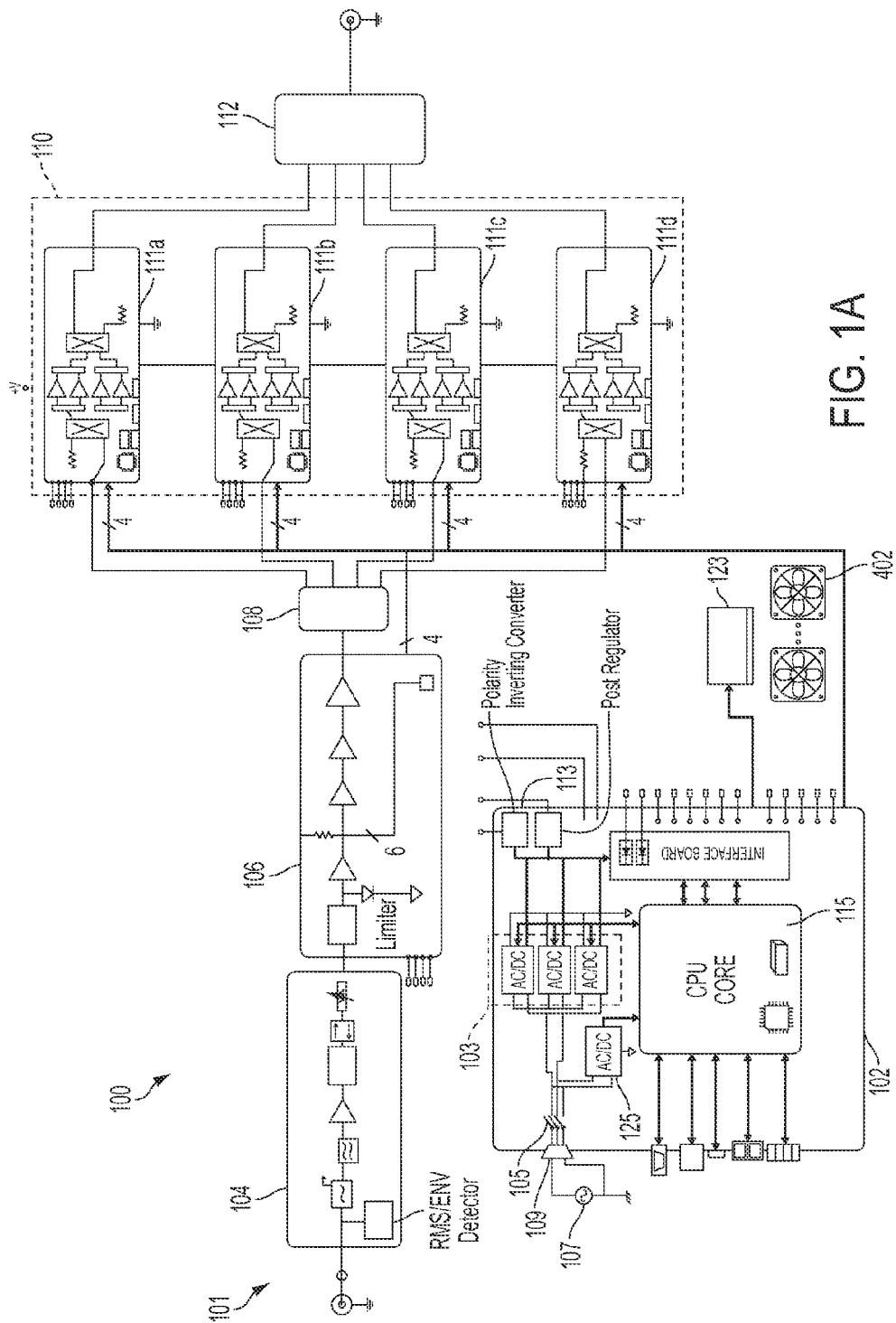
FIG. 1A is a block diagram of the RF amplifier according to an embodiment of the invention.
Figure 1B:
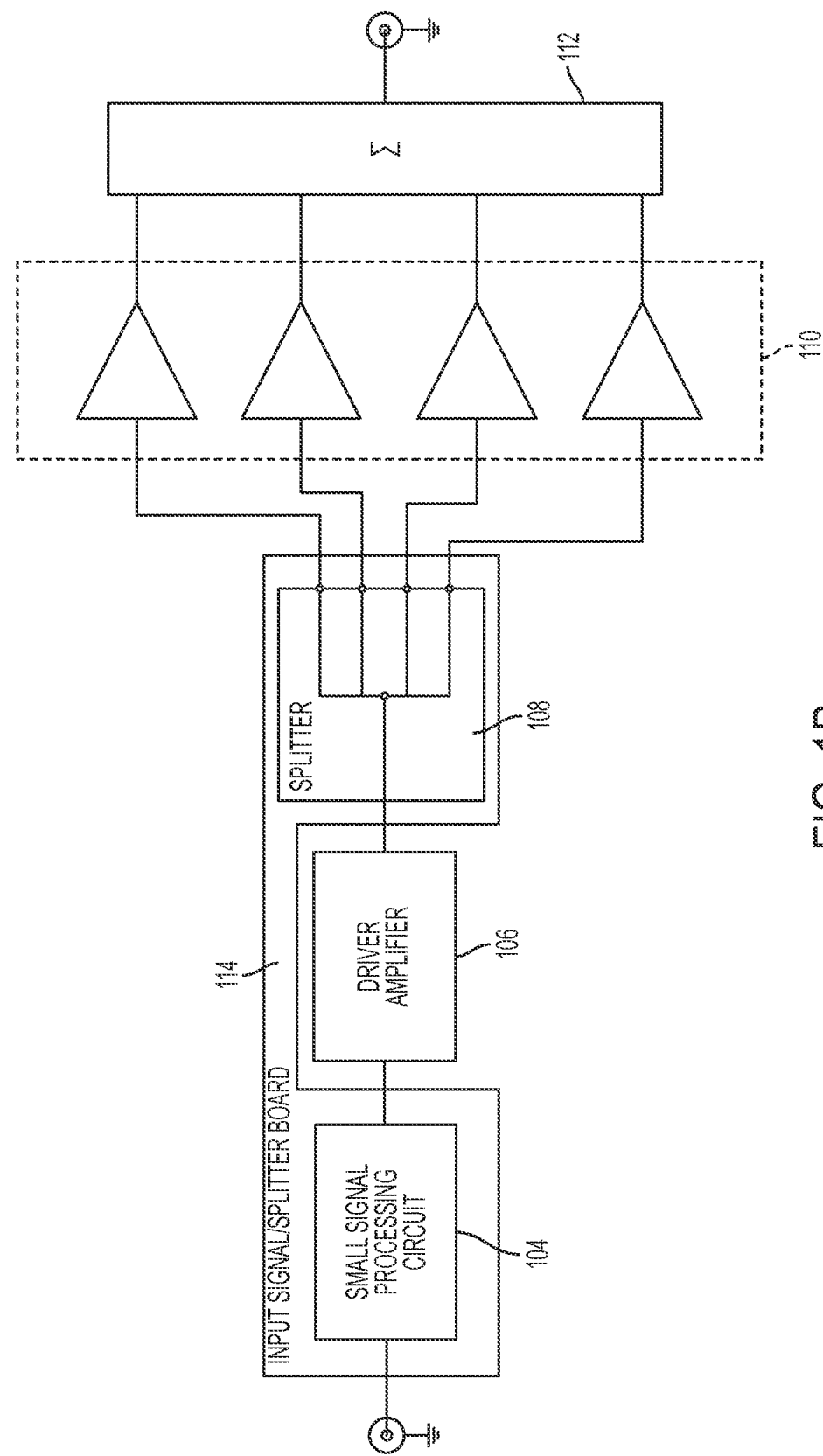
FIG. 1B is a block diagram of the RF amplifier showing an input circuit/splitter board and the electronic components disposed thereon according to an embodiment of the invention.

Turning to FIGS. 1A and 1B, the electronic components of an RF power amplifier architecture according to an embodiment of the invention are disclosed in detail. The power amplifier 100 includes a control system and power distribution circuit 102, a small signal processing circuit 104, a driver amplifier 106, a splitter 108, a final stage 110 and a combiner 112. As shown in FIG. 1A, in general, an input signal 101 enters the small signal processing circuit 104 where, for example, the output level or gain is controlled and the signal phase is set. From the small signal processing circuit 104, the signal is input into the driver amplifier 106, where in some embodiments the signal is amplified by approximately 53 dB+/−2 dB, although this amplification amount can vary according to the invention. From the driver amplifier 106, in some embodiments, the signal is input into the splitter 108, where it is divided into four equal amplitude signals. From the splitter 108, the signal is input into the final stage 110. The final stage 110, for example, is comprised of four high power parallel stage modules 111a-111d of, e.g., approximately 15 dB+/−2 dB gain (this gain can vary in different embodiments of the invention), to amplify each of the signals to about 55 dBm+/−1 dB. A high power combiner 112 combines them together to achieve a total gain of, e.g., 61 dBm. In some embodiments, each of the four final stage modules 111a-111d can provide up to 250 W each, for a total of 1 kW, and the RF power amplifier can operate over a range of approximately 500-1000 MHz. The RF power amplifier can be operable over a wide range of powers and frequencies in various embodiments. For example, it can have a power range of approximately up to 2 kW pulse and 1 kW continuous wave. Advances in semiconductor and thermal management technologies, however, can further advance these ranges within the scope of the invention. The RF power amplifier can have a frequency range that extends to approximately 6 GHz.

As shown in FIG. 1B, the small signal processing circuit 104 and/or the splitter 108 may be placed on the same printed circuit board (PCB), motherboard 114. In such an arrangement, the driver amplifier 106 may be disposed on a separate printed circuit board; however, other arrangements of the components on one or more printed circuit boards are contemplated by the disclosure and are included within the scope of this disclosure. Similarly, it is possible for the motherboard PCB to include a first PCB for at least the splitter and a second PCB for the controller and signal circuits. It is also possible, for instance, to include the small signal processing circuit 104, splitter 108, and driver 106 on the same printed circuit board. In some embodiments, the RF components of the splitter 108, the combiner 112, and the final stage 110 can interface using a blind made connector or a tab, thereby substantially eliminating RF losses. For example, the blind made connector can be a snap-in connector and the tab can be a copper piece soldered directly to two of the splitter 108, the combiner 112, and the final stage 110. In this embodiment, for example, the key RF components of the splitter 108, the combiner 112, and the final stage 110 interface without use of coaxial cables. The final stage 110 can interconnect directly to the motherboard PCB 114 for control functions and auxiliary power supplies. The invention can also use a serial bus to interconnect the final stage 110 and the motherboard PCB 114 for control functions. In addition, a carrier of the final stage 110 can shield the power rail. The carrier of the final stage 110 and the heat sink serve as a ground that substantially surrounds the power rail, thus eliminating a need for EMI filters Returning to FIG. 1A, the control system and power distribution circuit 102 reads, monitors and controls the status of each RF stage and is responsible for the overall system operation, including the distribution of power to the various components of the RF power amplifier. In some embodiments, the power supply system, for example, includes three standard blocks of 1500 W AC/DC converter power supplies 103 to power the electronic components. An auxiliary AC/DC power supply 125 may also be included to enable the system to boot-up and to supply power to the driver amplifier 106. For example, the auxiliary power supply 125 may provide 12 Vdc and 5 Vdc power to the control system, and 24 V to the driver amplifier 106. An AC input 107, through an input connector 109, is input into the circuit breaker 105 and then to an AC distribution board (ACDB) (not shown). As previously mentioned, three standard 1500 W power supplies 103 may also connect the ACDB (not shown) to form the main power supply. These power supplies are supplied with a DC voltage 113 and operate in parallel through the ACDB to supply power to the final stage 110. The AC input 107 can be configured in parallel or in three phase arrangement at the input AC connector 109 of the ACDB. The DC voltage can be adjusted, for example, to a range between 40 and 48V by the control system improving the overall system efficiency. Circuitry in the control system monitors and controls the power supply.

The control system and power distribution circuit 102 also includes a CPU core 115 that controls the circuitry and is disposed on a motherboard (not shown) that is connected to the final stage 110. The CPU core 115 may include an embedded processor, such as an ARM processor, and can also include a field programmable gate array (FPGA), that alone or together perform all functions that requires fast control action. The CPU core 115, for example, can route various input signals (e.g., an Ethernet signal, a USB signal, a remote bus signal and/or a system input/output signal) to the appropriate circuitry, control the gain and the power level of the RF output, including an automatic level control (ALC) power limiter circuit (not shown) and an automatic gain control (AGC) circuit (not shown), and initiate system protections like overdrive protection (e.g., to make sure the input signal does not exceed the duty cycle protection limits) and voltage standing wave ratio (VSWR) protection (e.g., to make sure system RF transistors are protected). In other implementations, the CPU core 115 may be any type of microprocessor or microcontroller suitable for performing the functions described herein. The CPU core 115 can include, for example, any type of processor, including one produced by INTEL, AMD, Freescale, etc. The CPU core 115 may also monitor the duty cycle in the case of pulse amplifier application and generate the pulse width modulation that controls auxiliary devices in the amplifier, such as the speed of fans 402 and the LCD screen 123. For example, fans 402 may be provided to cool the electronic components of the RF amplifier and the LCD screen 123 may be provided as a user interface to set gain and power levels, monitor system performance, reset the system, and perform other user interface functions.

In some embodiments, a daughterboard (not shown) may be connected to the motherboard (not shown) having the CPU core 115 disposed thereon. The daughterboard may have disposed thereon a second microprocessor (not shown), e.g., an ARM 9 microprocessor. This second microprocessor may be configured to run any application software for the RF amplifier on, e.g., a Linux embedded operating system (OS). The second microprocessor may be connected to external memory, or include internal memory, that may store any system information, including any computer program, machine code, data, configuration information, etc., in one or more databases, e.g., in separate tables or fields. Such system information may be used to control the RF amplifier, display on the LCD 123 and/or used by a WEB server (not shown) to connect to the RF amplifier remotely. As such, in some embodiments, the daughterboard and related components connect to all of the electronic components to monitor and control them.

The control system and power distribution circuit 102, in some embodiments, delivers signals via wiring that interconnects subassemblies like the motherboard to rear and front panels as well as the power distribution circuit to the motherboard. This wiring is isolated and shielded from other system components.

As previously mentioned, four main blocks compose the remainder of the RF amplifier: the small signal processing block 104 and splitter 108, the driver amplifier 106, the final stage 110 and the combiner 112. As also mentioned, the small signal processing circuit 104 and splitter 108 may be disposed on the same printed circuit board, which is shown with numeral 114 on FIG. 1B and may be referred to as the input signal/splitter board 114. In such an arrangement, the circuitry disposed on the input signal/splitter board 114 can operate, e.g., between the range of 20 to 1000 MHz.

Turning to FIG. 1C, the small signal processing circuit 104 includes an input signal detector 116, an RF switch 117, a low noise amplifier 118, a high pass or low pass selectable filter 120 (120a and 120b), an equalizer 122, a vector modulator 124 and a variable voltage attenuator (VVA) 126. The input detector 116 monitors the input signal which, for example, at +10 dBm triggers input overdrive protection by turning off the RF switch 117. The low noise amplifier 118, for example, isolates the source generator from the remaining of the system and provides the appropriate noise factor (NF) for the RF amplifier. The high pass or low pass filter 120 can be configured for a particular application. In some embodiments, for example, the high or low pass filter 120 may be configured as a high pass filter with a cut off frequency of about 500 MHz, e.g., to avoid driving the RF amplifier with an out-of-band frequency. The equalizer circuit 122, in some embodiments, is provided to allow adjustments of the system response of the RF amplifier. For example, in some embodiments the system response of the RF amplifier may be sub-optimal, and the equalizer allows for system response adjustments at the factory. The vector modulator 124 adjusts the phase of the RF amplifier. Accordingly, in some embodiments, multiple RF amplifiers can be stacked by phase tuning each of them. The VVA allows the user to choose the power management mode for the RF amplifier, e.g., Automatic Level Control (ALC), Automatic Gain Control (AGC) or Manual Gain Control (manual).

The output of the small signal processing circuit 104 excites the driver amplifier circuit 106.

Turning to FIG. 1D, the driver amplifier 106 is shown. The driver amplifier 106, for example, may operate between 20 to 1000 MHz to provide, e.g., a minimum of 100 W of output power over the band. The driver module comprises a limiter 128, a front end amplifier 130 with about 22 dB of gain, and a digital step attenuator (DSA) 132 that controls the gain of, and protects against fault conditions in, the driver amplifier 106. From the DSA 132, the signal is input into a back-end amplifier 134 and two high power stages 136 (136a and 136b)

and 138 (138a and 138b), each comprised of two amplifiers arranged in a push-pull configuration, to provide, e.g., approximately 32 dB of gain. Overall, in embodiments where the driver amplifier achieves such a gain, the driver amplifier 106 has an operating power of approximately 40 W or 46 dBm. The driver amplifier circuit 106, for example, is controlled by a microcontroller 140 that biases the output transistors, controls the blanking function, performs temperature compensation, provides protection over high current and high temperature as well as monitors the currents of the devices and the operating temperature for the driver amplifier 106. The microcontroller 140 can be from control system 102 (FIG. 1A) or can be a different microcontroller. The components forming the driver amplifier 106 may be disposed on a printed circuit board that is distinct from the input signal/splitter board 114 (FIG. 1B).

The driver amplifier circuit 106 output returns to the input signal/splitter board 114 and is divided, for example, by 4 from 20 to 1000 MHz by a splitter 108 (FIGS. 1A and 1B) with an insertion loss of, e.g., 1 dB+/−0.5 dB. In some embodiments, the splitter 108 may be a combination of a microstrip line and a coaxial transformer that operates from, e.g., 20 to 1000 MHz with 0.5 to 1.5 dB losses. For example, in some implementations the splitter 108 may generate 4 signals, with each signal being input into separate modules 111 of the final stage 110 (discussed below). However, in other embodiments the splitter 108 may generate more than 4 signals, e.g., where the final stage 110 includes more than four modules. Still in other embodiments, the splitter 108 may generate fewer than four signals, e.g., in implementations where the final stage 110 includes fewer than four modules. Accordingly, in most embodiments, the signals generated by the splitter 108 correspond to the number of modules 111 in the final stage 110.

Figure 1E:
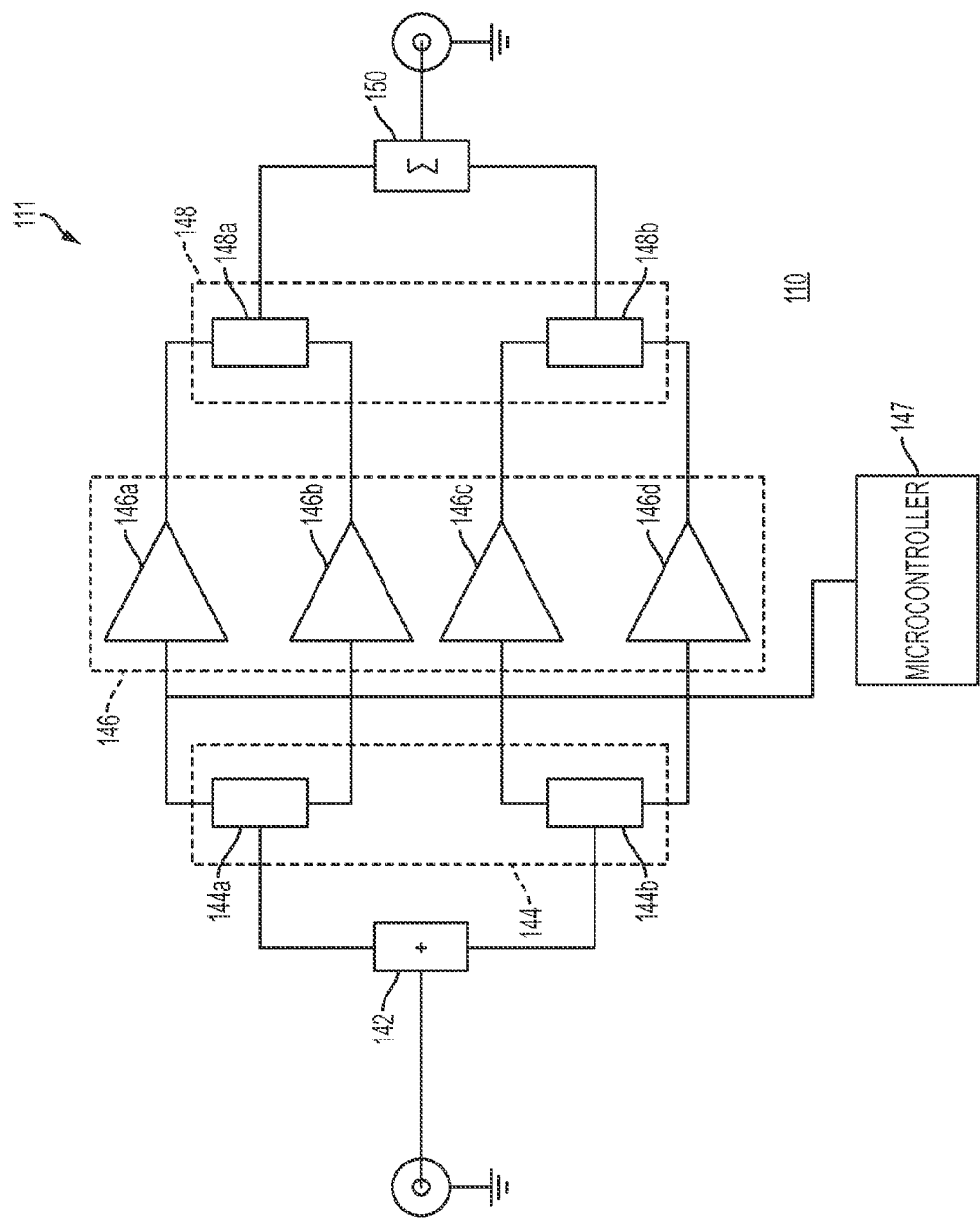
FIG. 1E is a block diagram of a module of a final stage according to an embodiment of the invention.

Turning to FIG. 1E, in the embodiment shown, four signals are input into the final stage 110 of the RF amplifier from the splitter 108 (not shown, but to the left of FIG. 1E). The final stage 110 has, e.g., four modules 111 that are identical and operate in parallel. In some embodiments, each of the modules 111 has two transistor pairs 144 (144a and 144b) and 148 (148a and 148b) that operate as a push-pull structure. Each transistor in the transistor pair 144 receives an input from divider 142, and outputs four signals into amplifiers 146a-146d. The amplifiers 146a-146d provide four outputs to the transistor pair 148, which then outputs two signals to a two-way combiner. In this arrangement, each module 111 provides broadband amplification with a capability of, e.g., about 400 W. The module 111 is also controlled by a microcontroller 147 that biases the transistors, compensates for temperature, measures the operating temperature, and communicates to the system controller the status of the module and monitors its operating conditions. As one skilled in the art will appreciate, the microcontroller 147 can be from the control system 102 (FIG. 1A) or can be a different microcontroller. Importantly, the electronics of each of the modules 111 are disposed on printed circuit boards that are separate from each of the other modules 111.

Turning back to FIG. 1A, the combiner 112 is a passive component that adds in phase all the outputs from the modules 111 of the final stage 110. For example, in some implementations, such as that shown in FIG. 1A, the combiner 112 may combine four signals. However, in other embodiments the combiner 112 may combine more than four signals, e.g., where the final stage includes more than four modules. Still in other embodiments, the combiner 112 may combine fewer than four signals, such as two signals, in implementations where the final stage 110 includes fewer than four modules 111. Accordingly, in most embodiments, the number of signals combined by the combiner 112 corresponds to the number of modules 111 in the final stage 110.

Figure 1F:
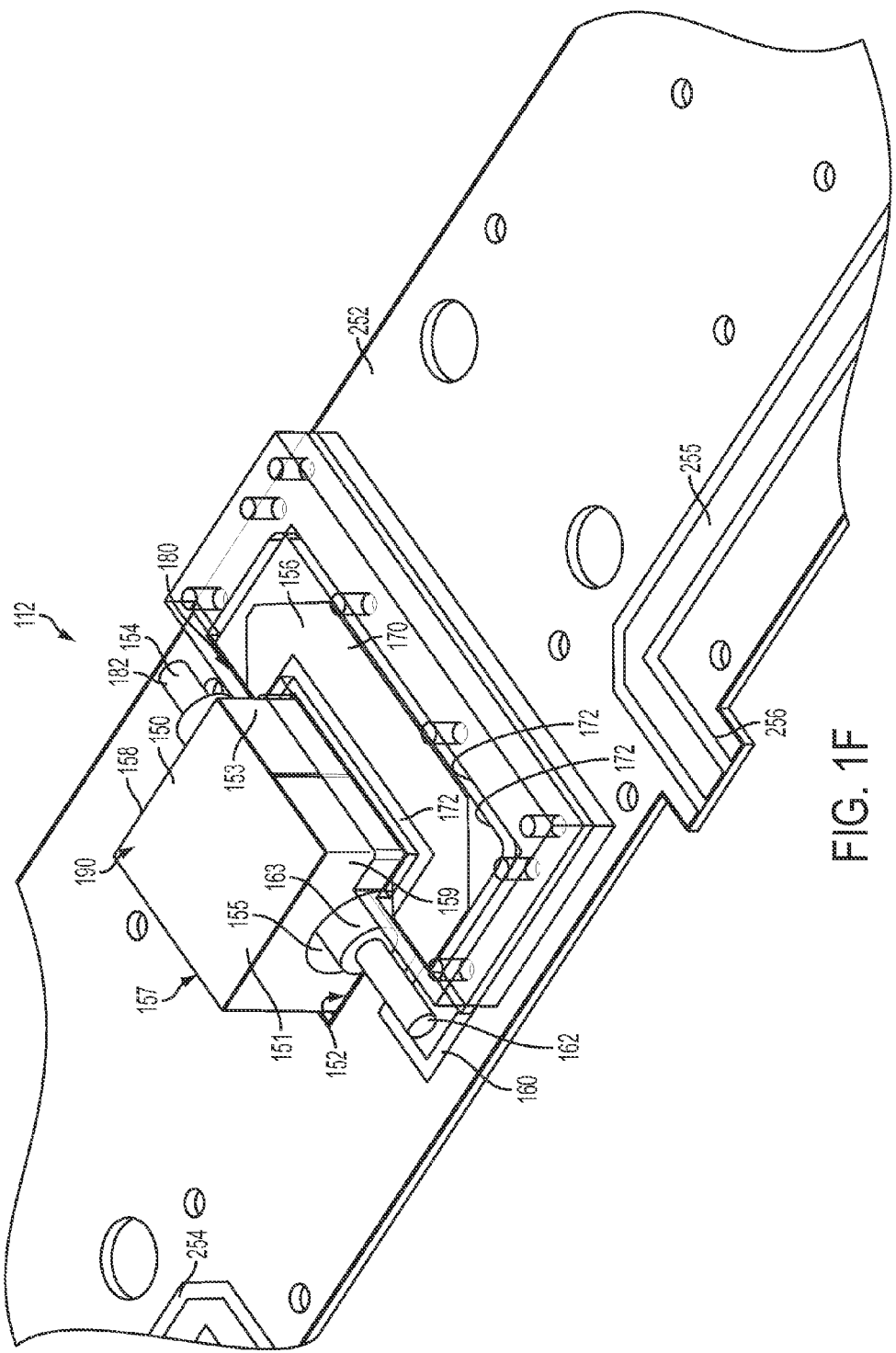
FIG. 1F is a block diagram of a combiner according to an embodiment of the invention.
Figure 2A:
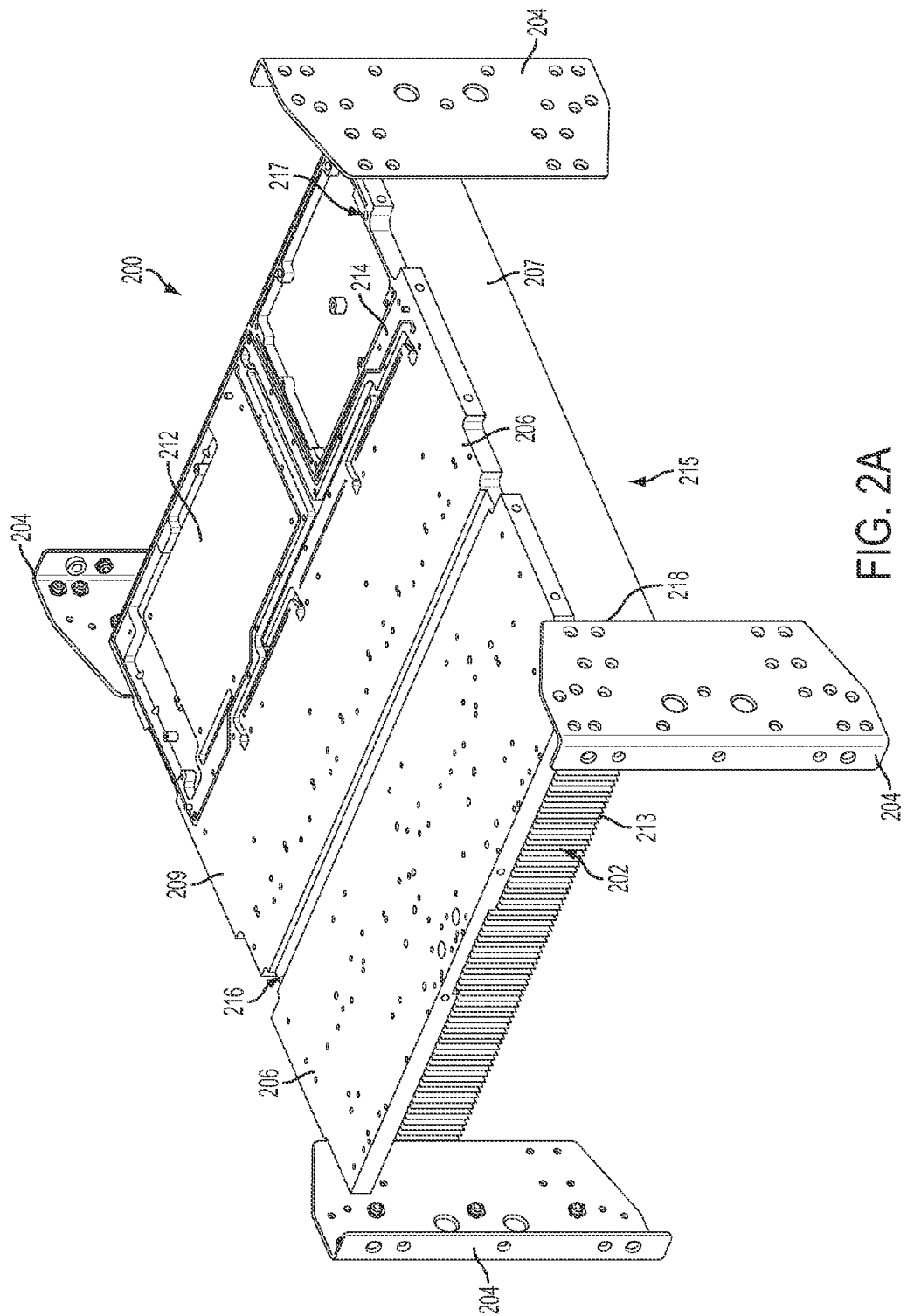
FIG. 2A is a perspective view of a heat sink and electromagnetic field ("EMF") shield having corner brackets for bracing the heat sink and EMF shield into a case according to an embodiment of the invention.
Figure 2B:
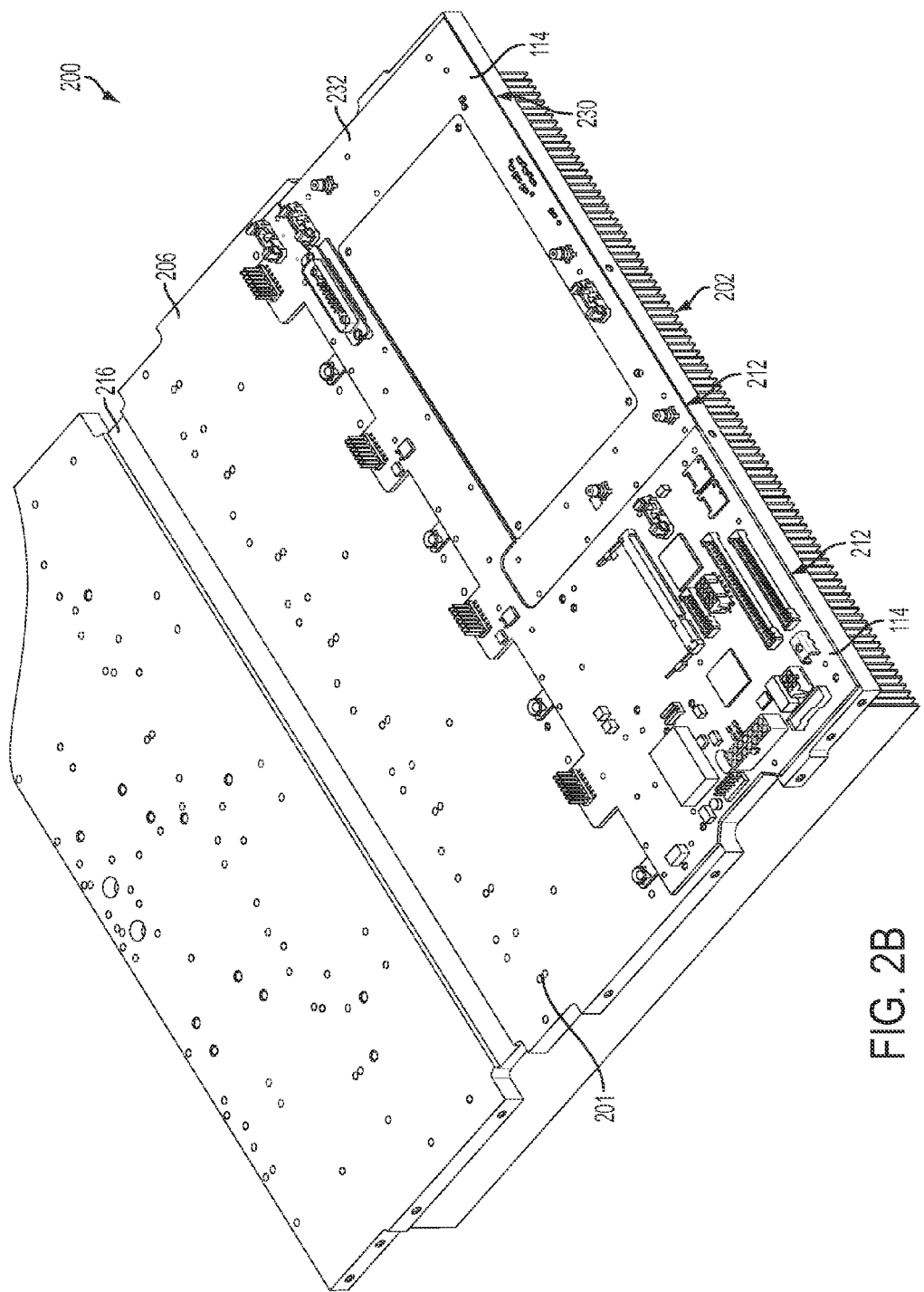
FIG. 2B is a perspective view of the heat sink and EMF shield having a printed circuit board ("PCB") disposed thereon according to an embodiment of the invention.
Figure 2D:
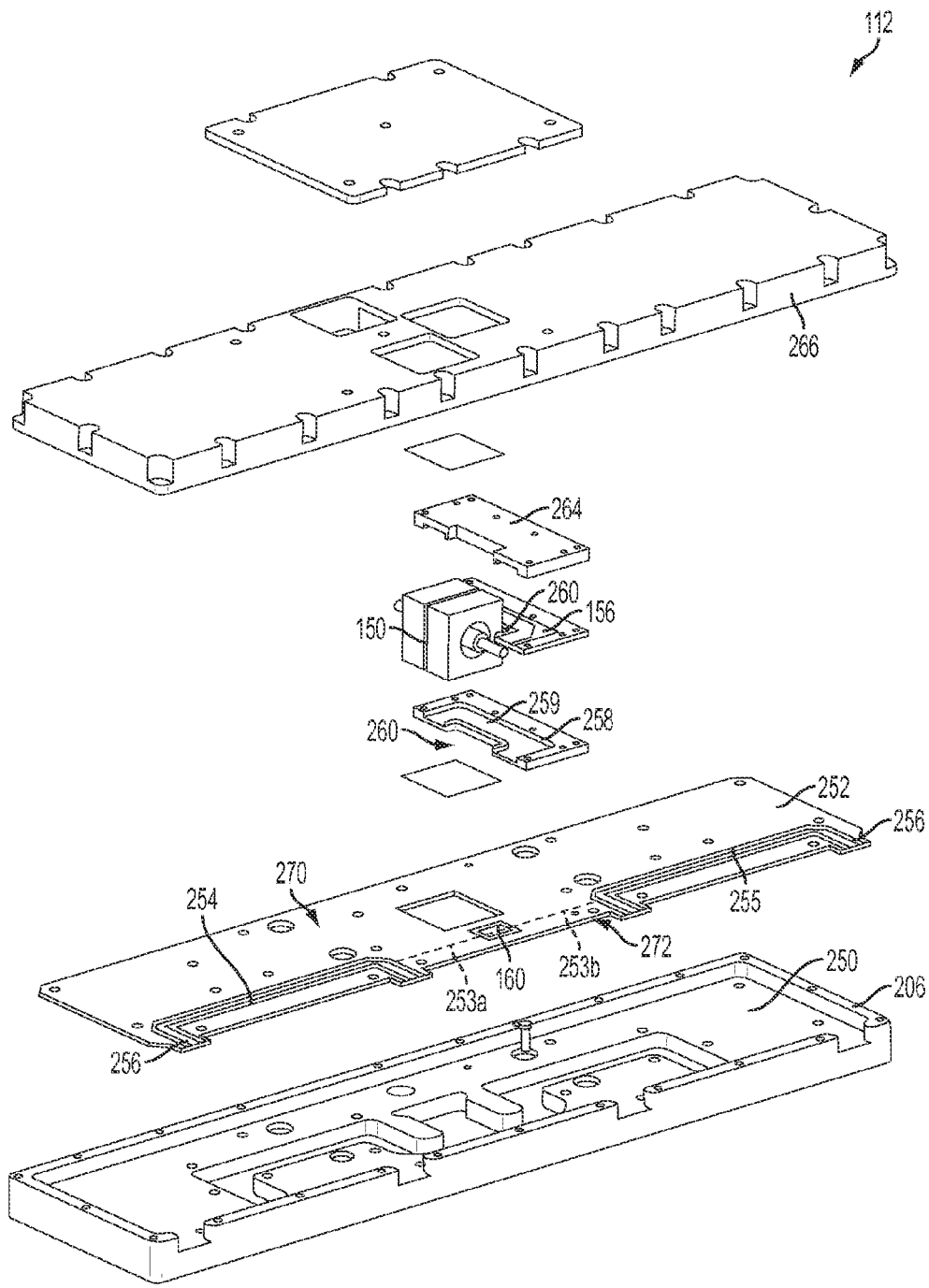
FIG. 2D is an exploded, assembly view of the combiner according to an embodiment of the invention.

Referring to FIGS. 1F and 2D, the outputs from the modules 111 of the final stage 110 connect to the wiring layer 252. As described in greater detail below, the wiring layer 252 has two u-shaped wire assemblies 254, 255, with each of the two arms 256 of each u-shaped wire assembly 254, 255 connecting to one of the modules 111. The two u-shaped wiring assemblies 254/255 extend to the bottom side 270 of the wiring layer 252, where each of the wiring assemblies 254/255 connects to the wiring 160 in the center of the wiring layer 252. This brings together the four outputs from the modules 111 of the final stage 110.

As shown in FIGS. 1F and 2D, the combiner 112 is comprised of wiring 160/254/255, disposed on the wiring layer 252 (which, in turn, is disposed on base plate 206) and connected to the modules 111 (FIG. 1A). The combiner also includes a transmission line transformer 190 having one transmission line that is a coaxial cable 154 through a ferrite core 150, which enables the combiner 112 to operate at a low frequency, and a second transmission line that is stripline 156 that has a different mechanical length from the coaxial cable 154, but has the same electrical length as the coaxial cable 154. The physical length of the stripline 156 is longer than a physical length of the coaxial cable 154.

The ferrite core 150 of the transmission line transformer 190 has a top surface 151 and a bottom surface 152, as well as a first side surface 153, a second side surface 159, a third side surface 158, and a fourth side surface 157. A hole 155 is positioned in the center of the second and third side surfaces 159, 158 of the ferrite core 150, and the hole 155 extends through the ferrite core 150 from the second side surface 159 to the third side surface 158. A coaxial cable 154, dimensioned to the highest operating frequency of the RF amplifier, is positioned inside the hole 155, and extends through the ferrite core 150 to connect between a wiring 160 on the wiring layer 252 and the output of the RF amplifier (not shown) though coaxial cable terminus 182 and a filter (not shown). The coaxial cable 154 is preferably constructed from a copper wire 162 insulated by a Teflon dielectric 163, although this may differ in different embodiments of the invention. The coaxial cable 154 may, for example, have a relative permittivity $\in_{r1}$ of 2.2 (also referred to herein as a dielectric constant, which is the relative permittivity at zero frequency). As one skilled in the art will appreciate, the ferrite core 150 suppresses transients in the coaxial cable 154, thereby reducing impedance and transmission losses in the signal through the coaxial cable 154.

A transparent view of stripline 156 is shown in FIG. 1F, and the stripline 156 has a second relative permittivity $\in_{r2}$, for example of 1, when compared to the coaxial cable 154. The stripline 156 also connects to the wiring layer 160 and may be grounded by connecting the stripline 156 to the wiring layer 252 at stripline terminus 180. The stripline 156 includes, for example, conductive interior layer 170, two dielectric layers 172 (one on the inside and one on the outside of the stripline 156), and two ground plates (not shown). In addition, FIG. 1F shows one stripline 156. In some embodiments, a second stripline (not shown) having the same shape as stripline 156 can be connected in parallel below stripline 156 with the same connection points to the adjacent structures. This stripline (not shown) can be separated by air from stripline 156. The resulting dual-stripline structure results in half of the current flowing on stripline 156 and half flowing on the adjacent stripline (not shown). In some embodiments, the dielectric layers for the stripline 156 may be air. The interior layer 170 is connected to the wiring 160 on the wiring layer 252. The stripline 156 is routed around a portion of the ferrite core 150 and terminates substantially near the coaxial cable terminus 182 at ground connection 180.

In such an arrangement as described above, the electrical length of the stripline 156 is matched to the electrical length of the coaxial cable 154, although the physical lengths of the stripline 156 and coaxial cable 154 differ. The electrical length of the coaxial cable 154 is defined by its length and the first dielectric constant and the electrical length of the stripline 156 is defined by its length and the second dielectric constant. In particular, the physical length of the stripline 156 is longer than the physical length of the coaxial cable 154 by a factor given by the square root of the first dielectric constant divided by the square root of the second dielectric constant. In other words, in the embodiment described above, the stripline 156 is longer than the coaxial cable 154 by a factor given by: square root $(\in_{r1}/\in_{r1})$=square root $(2.2/1)$=1.48. In this embodiment, the combiner 112 is operable from 20 MHz to 1 GHz.

Figure 1G:
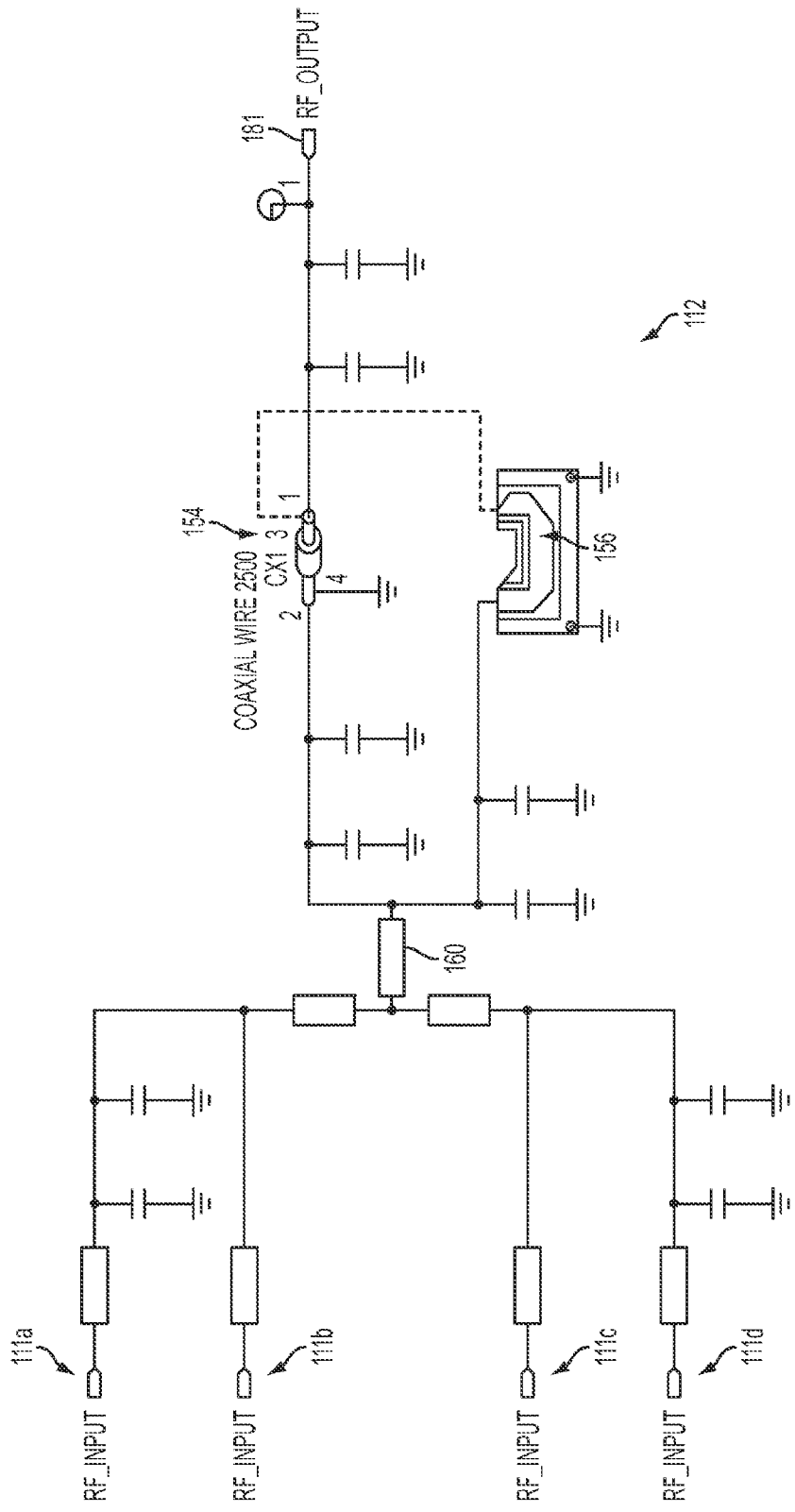
FIG. 1G is an equivalent circuit figure for the combiner shown in FIGS. 1F and 2D.

FIG. 1G is an equivalent circuit for the combiner 112 shown in FIGS. 1F and 2D. The combiner 112 operates by transforming the parallel impedance of all four modules of the final stage into one output impedance of 50 Ohms and by adding the power of the four modules 111a, 111b, 111c, 111d into a single output 181.

Turning to FIG. 2A, a heat sink assembly 200 for the RF power amplifier is shown. The heat sink assembly 200 includes base plate 206, ducts 202, crossbars 207, and brackets 204. In the embodiment shown, the base plate 206 of the heat sink assembly 210 includes a top surface 209, a side surface 213 and a bottom surface 215. The top surface 209 of the base plate 206 has formed therein at least one recessed groove or portion 212 for receiving the input signal/splitter board 114, in addition to grooves 214 for receiving associated power rails for the input signal/splitter board 114. In addition, separate grooves can be used for the electrical components of the controller and the splitter. In addition, the top surface 209 of the base plate 206 may also have a groove 216 formed in a position removed from, and parallel to, the groove 214, to receive a power rail for connecting each of the modules 111 of the final stage 110. The groove 216 can receive the power rail in order to shield the power rail. Underneath the base plate 206, on the bottom surface 215, ducts 202 are arranged to provide air cooling to electronics disposed on, or substantially within, the heat sink assembly 200. As shown, the ducts 202 are formed underneath the base plates 206 on the bottom surface 215, substantially parallel to the grooves 214 and 216, and perpendicular to the longitudinal dimension of the base plates 206. As one skilled in the art will recognize, in such an arrangement, cooling fans (discussed below) can generate sufficient air flow to the bottom surface 215 of the base plate 206 to sufficiently cool base plate 206 and provide heat protection to the electronics positioned therein.

On two sides of the heat sink assembly 210, crossbars 207 are arranged, also perpendicular to the longitudinal dimension of the base plates 206, in parallel with the ducts 202. The bottom surface 215, proximate to the side surface 213, of each of the base plates 206 may be connected to a top, side surface 217 of the crossbars, e.g., using rivets, pins, pegs, screws, adhesive, friction fit, etc. At each distal end 218 of each of the crossbars 207, mounting brackets 204 are arranged, and are connected to one or more of the crossbars 207 and base plate 206 using, e.g., rivets, pins, pegs, screws, adhesive, friction fit, etc. As shown in FIG. 2A, the mounting brackets 204 may be arranged so that they contact the crossbars 207 and one or more side surfaces 213 of the base plate 206. As such, each bracket 204 is substantially L-shaped so as to potentially receive two side surfaces 213 within the interior right angle portion of the bracket 204. In some embodiments, however, the crossbars 207 may be longer than the ducts 202 and base plate 206, so that the brackets 204 only contact on the surface of the base plate 206. Such an arrangement may be beneficial for maximizing air flow through the ducts 202. As one skilled in the art will appreciate, in either arrangement of the mounting brackets 204, the base plate 206, ducts 202, crossbars 207, and mounting brackets 204 form a table like surface for receiving the electronic components described above.

As one skilled in the art will also appreciate, each of the components forming the heat sink assembly 210 may be fabricated from, e.g., an aluminum alloy, copper, synthetic diamond, composites (e.g., a copper-tungsten pseudoalloy, AlSiC, dymalloy), etc., as is appropriate for circuitry and electronics described herein. Moreover, one or more of these elements may be extruded or machined, depending upon the material used to fabricate it, to receive the printed circuit boards and power rails described above (not shown), in recesses or grooves. Moreover, though the term "base plate", singular, has been used to describe the heat sink, one skilled in the art will recognize that the base plate 206 may be one or more base plates 206, e.g., the base plates 206 may be extruded as a single plate, or may be machined or extruded as multiple plates joined together using a connector, e.g., screws, rivets, friction fit, etc., as may be appropriate for the application.

Turning to FIG. 2B, a partial electronics assembly showing the input signal/splitter board 114 mounted to the base plate 206 is shown. As can be seen, the base plate 206 includes a plurality of holes 201 drilled on the surface for mounting a plurality of printed circuit boards carrying the circuits described above, including the input signal/splitter board 114. The input signal/splitter board 114 has a top side 230 and a bottom side 232. On the top side 230 of input signal/splitter board 114, portions of the electronic components of the small signal input circuit 104 and splitter 108 that generate heat are disposed. On the bottom side 232 of the input signal/splitter board 114, connectors and electronic components needing less heat dissipation are disposed. However, when mounted to the base plate 206, the input signal/splitter board 114 is inverted, e.g., the top side of the input signal/splitter board 114 contacts the top surface 209 of the base plate 206, and the electronic components disposed on the top side 230 recede into the recess 212 (discussed above) formed in the base plate 206. In this arrangement, the electronic components are substantially encased in the recess between the base plate 206 and the input signal/splitter board 114. FIG. 2C is a partially transparent view of the input signal/splitter board 114 showing the electronic components disposed in the recess 212. Also shown are connectors 234 connecting the printed circuit board to the base plate 206. As with the connectors above, the input signal/splitter board 114 may be connected to the base plate 206, using, e.g., rivets, screws, adhesive, friction fit, pegs, etc. Accordingly, the base plate 206 can function as a heat sink. This heat sink defines a base 206 of the RF power amplifier and includes, in this embodiment, at least two grooves 212 formed therein. The electrical components of the splitter 114 can fit within one of the grooves, and the electrical components of the controller can fit within the other of the grooves. These components, therefore, are substantially disposed within the heat sink/base 206. In some embodiments, as explained above, a power rail is also provided, and is also disposed substantially within a groove 216 in the heat sink/base 206, to distribute a DC voltage to the final stage 110 and various amplifier modules comprising the final stage 110. In this arrangement, the heat sin/base 206 serves as an EMI shield for RF and spurious emissions from the electrical components of the RF amplifier, and it also dissipates heat from the electrical components of the splitter 114 and the electrical components of the controller. The heat sink/base 114 and the carrier of the final stage can also act as an EMI shield of the power rail.

Turning to FIG. 2D, the assembly of the combiner 112 is described, as also explained above. The combiner assembly includes a portion of the base plate 206. Similar to the portions described above, the portion of the base plate 206 receiving the combiner assembly includes recesses 250 for the ferrite core 150 and stripline 156, as well as recesses for wiring connecting the combiner 112 to the modules 111 (not shown in FIG. 2D). A wiring layer 252, having a top side 270 and a bottom side 272, is disposed over the base plate 206 and includes, e.g., copper or gold wiring disposed as two u-shaped assemblies 254/255, with each arm 256 of the u-shape connecting to one of the modules 111. The two u-shaped wiring assemblies 254/255 extend to the bottom side 270 of the wiring layer 252, where each of the wiring assemblies 254/255 connects to the wiring 160 through connections 253a and 253b (and to the transmission line transformer 190 as discussed above). Over the wiring layer 252, a second, u-shaped base plate 258 is disposed, having, e.g., a recesses portion 259 for receiving the stripline 156, and a u-shaped portion 260 for receiving the ferrite core 150, e.g., between the two arms 262 of the u-shaped portion 260.

Once the second base plate 258 is disposed on the wiring layer 252, the ferrite core 150 is disposed within the u-shaped portion 260, and the stripline 156 is disposed within recessed portion 259. A first cover portion 264 is disposed over the stripline 156, and a second cover portion 266 is disposed over the uncovered portions of the wiring layer 252, the first cover portion 264, and the ferrite core 150. As one skilled in the art will appreciate, the various base portions and cover portions described herein provide an EMI shield for the wiring and ferrite core.

As one skilled in the art will appreciate, although the combiner 112 is described as a separate unit from the base plate 206 carrying the electronic components of the final stage 110, the small signal input circuit 104, the driver amplifier 106, the splitter 108, and the controller 102, the base plate carrying the combiner 112 may be extruded as part of the base plate described above in connection with the other components or as a separate section connected to the other sections of the base plate using the methods described above. Moreover, the various base plates, cover plates and elements of the combiner 112 may be connected to the base plate 206 using, e.g., screws, rivets, pins, adhesive, pegs, etc.

Figure 3:
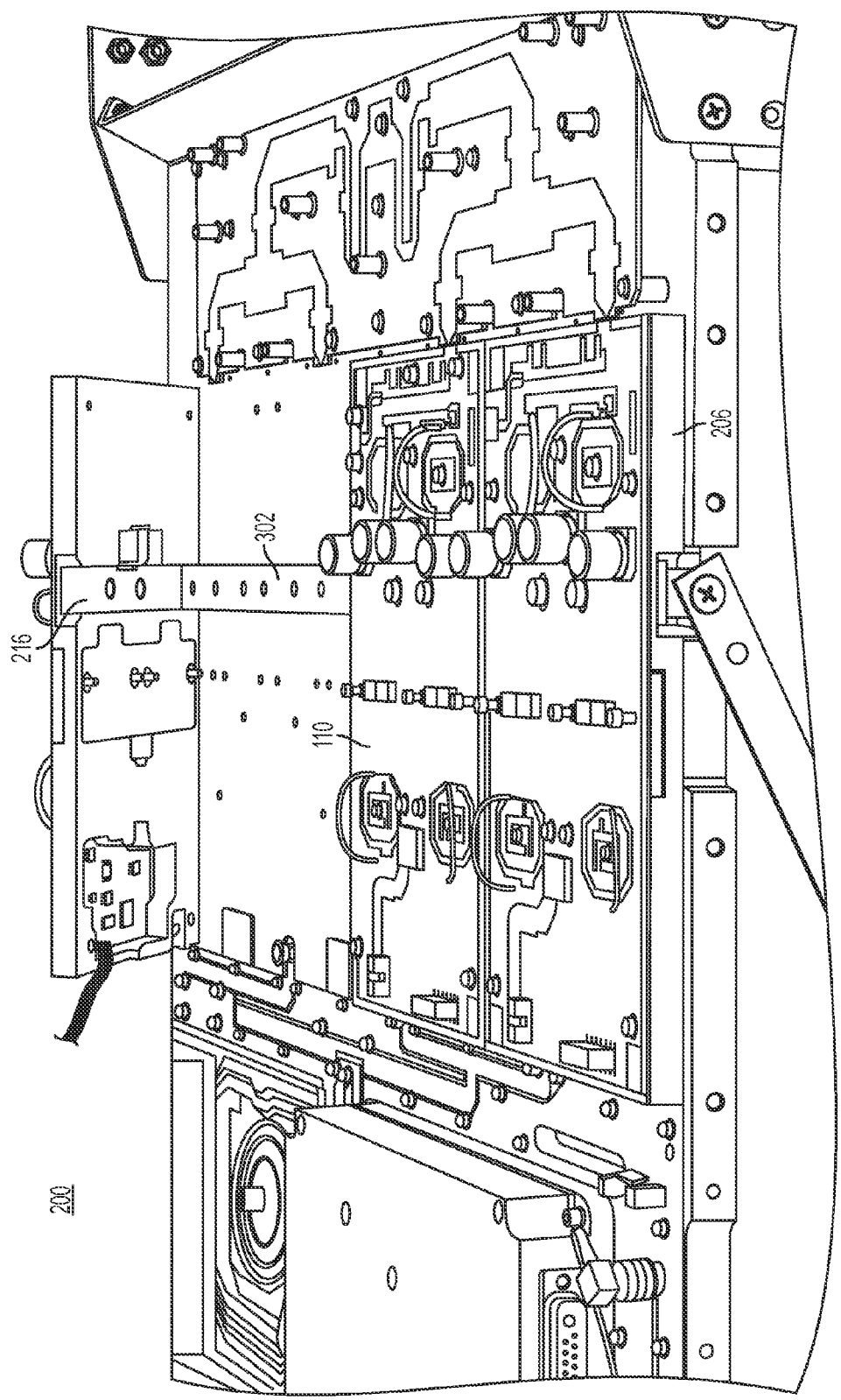
FIG. 3 is a perspective view of the heat sink and EMF shield showing a portion of the PCB having components that generate heat and/or an EMF being disposed so as to be substantially encased by the heat sink and EMF shield according to an embodiment of the invention.

FIG. 3 shows the printed circuit boards on the heat sink assembly 200 carrying the modules 111 of the final stage 110. Each of the modules 111 of the final stage 110 are disposed perpendicular to the recess 216. Inside recess 216, a power rail 302 is disposed. The power rail 302 is a fabricated from a conductive material, e.g., copper, and delivers power to each of the modules 111. As can be seen, once the power rail 302 is disposed in the recess 216, the power rail 302 is substantially encased by the base plate 206 and the printed circuit boards having the electronics components of the modules 111 disposed thereon. As one skilled in art will appreciate, the base plate 206 forms an EMI shield, thereby preventing spurious electromagnetic emissions from the power rail from adversely affecting the various electronic components of the RF amplifier, including the modules 111.

As assembled, the heat generating components on the bottom of the PCB structures can fit into one or more grooves in the heat sink assembly. The heat sink assembly, therefore, functions as both a heat sink and an EMI shield. Such an architecture reduces the number of components required for the RF power amplifier structure. In addition, the architecture described requires less human labor for assembly than existing RF amplifier designs.

Figure 4A:
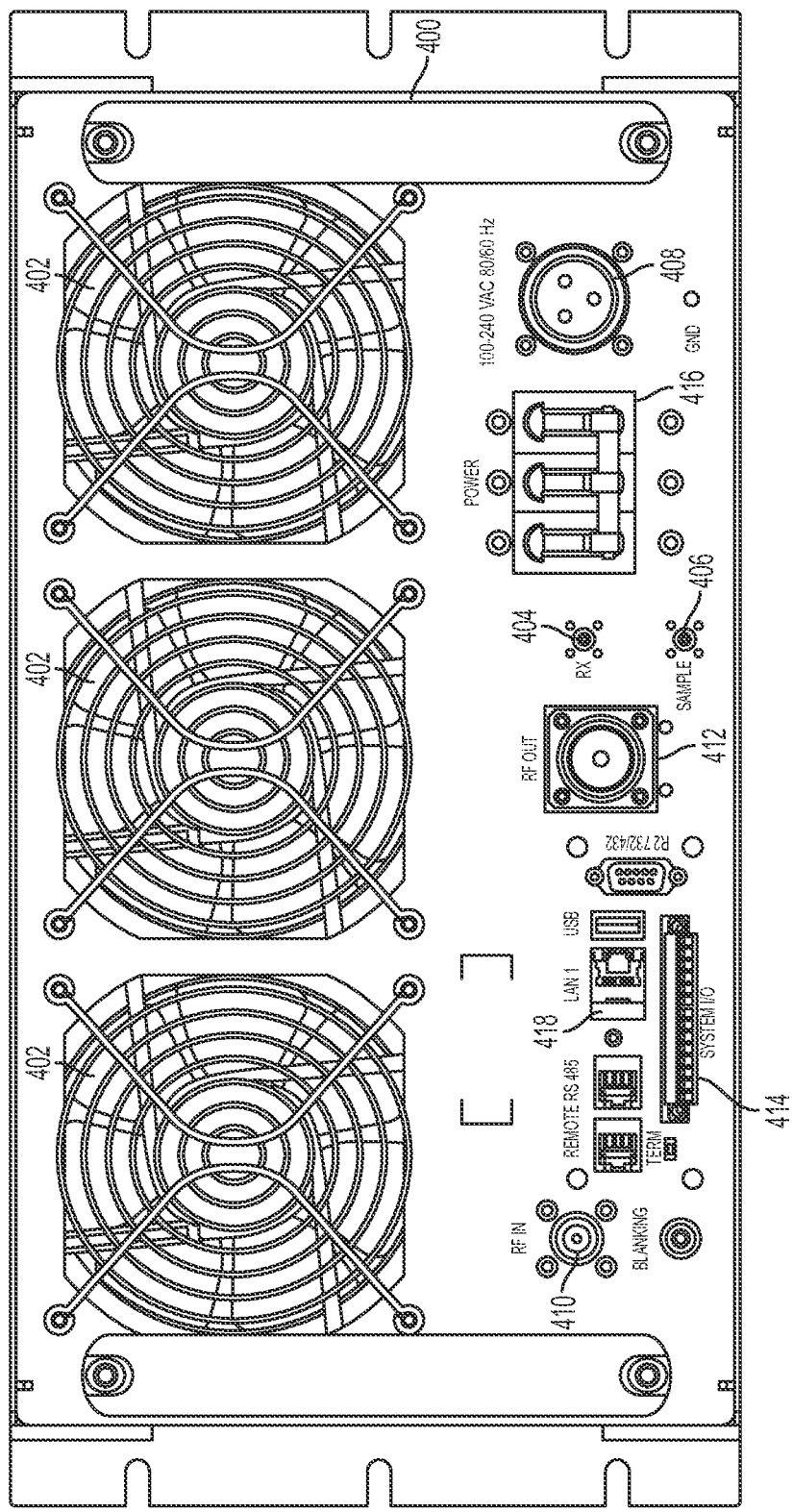
FIG. 4A is a view of back panel assembly of an RF amplifier showing a plurality of fans for generating air flow through a portion of the heat shield and cover portions over various printed circuit boards according to an embodiment of the invention.
Figure 4B:
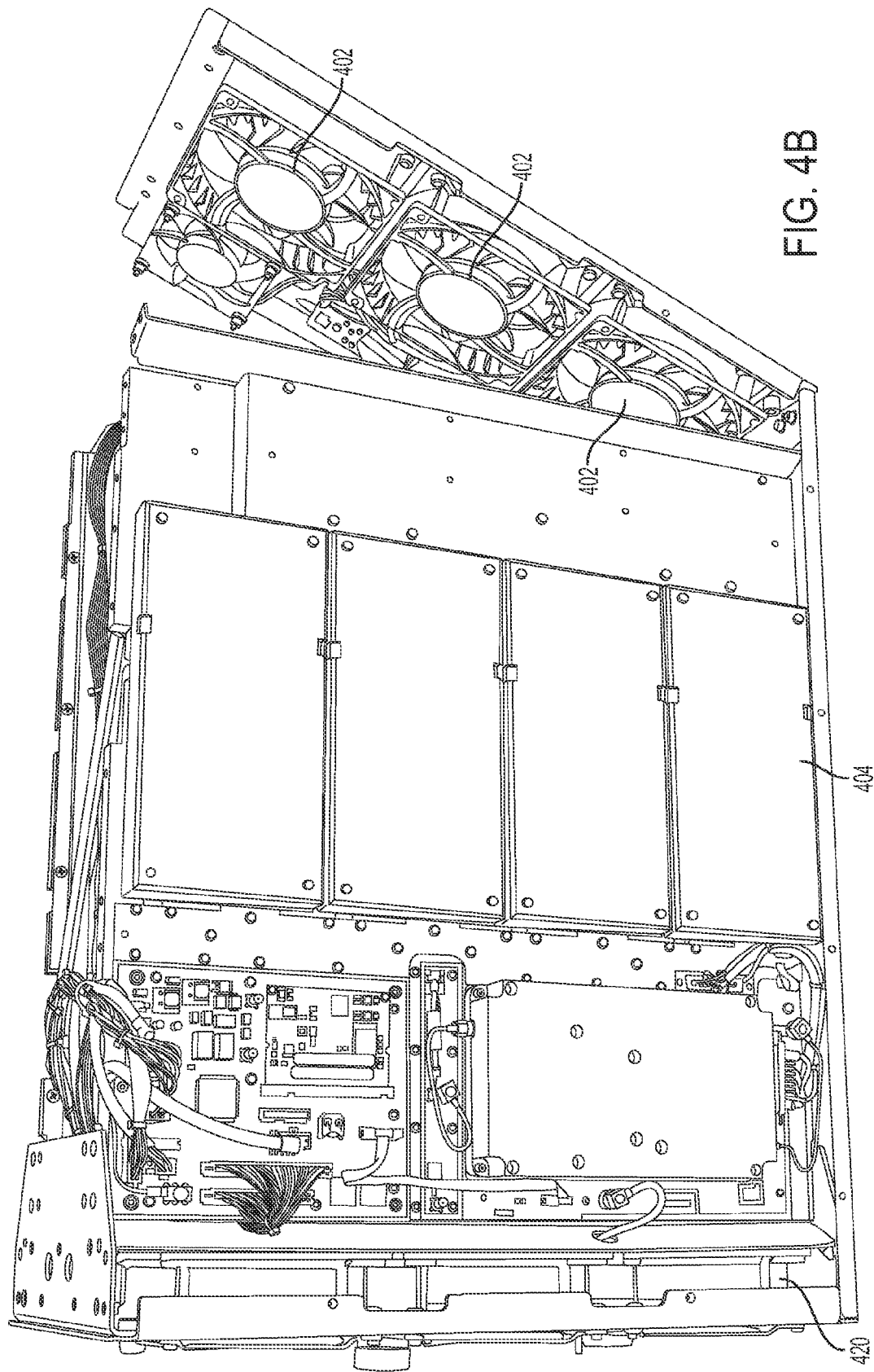
FIG. 4B is a view of the assembled RF amplifier showing a plurality of fans for generating air flow through a portion of the heat shield and cover portions over various printed circuit boards according to an embodiment of the invention.

Once the electrical components are disposed on the heat sink assembly 200, the remainder of the RF amplifier can be assembled, as shown in FIGS. 4A and 4B, which may include connections to external subsystems for monitoring, control, cooling and connections. The rear panel interface 400 may comprise a board (not shown), three fans 402, a BNC connector 404, the sample RF connector 406, the AC input connector 408, and the RF input connector 410, an output RF connector 412, system I/O connector 414, circuit breaker 416, Ethernet connector 418, and an interface board (not shown). FIG. 4 also shows a plurality of cover portions to provide further EMI shielding. The interface board includes connections to the fans 402, including a microcontroller/microprocessor (not shown) to control fan speed and a tachometer (not shown) to measure the RPMs of the fans 402. The front panel 420 assembly comprises a board (not shown), five fans (not shown), and LCD display (not shown). The interface board of the front panel assembly may comprise an LCD driver (not shown), buffers (not shown), a microcontroller/microprocessor (not shown) to control the speed of the fans, and a tachometer to measure the RPMs of the fans. The fans on the front panel 420 and rear panel 400 are assembled so that they provide air flow through the ducts under the base plate 206. In this way, the fans effectively cool the electronic components of the RF amplifier.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter, which is limited only by the claims which follow.

What is claimed is:

1. An RF power amplifier comprising:
   (a) a controller, a driver amplifier, a splitter, a final stage, and a combiner coupled together to function as the RF power amplifier;
   (b) a motherboard printed circuit board (PCB), the motherboard PCB including electrical components for at least the splitter;
   (c) a heat sink defining a base of the RF power amplifier, wherein the heat sink includes at least two grooves formed therein, wherein the electrical components of the splitter and electrical components of the controller fit within one or more of the grooves;
   (d) wherein the heat sink serves as an EMI shield for RF and spurious emissions, and wherein the heat sink dissipates heat from the electrical components of the splitter and the electrical components of the controller; and (e) a power rail to distribute a DC voltage to the final stage, wherein a power rail groove of the heat sink shields the power rail.

2. The RF power amplifier of claim 1, wherein the motherboard PCB includes a first PCB and a second PCB, wherein the first PCB includes the splitter, and wherein the second PCB includes the controller and signal circuits.

3. The RF power amplifier of claim 1, wherein RF components of the splitter, the combiner, and the final stage interface using at least one of a blind made connector and a tab, thereby substantially eliminating RF losses.

4. The RF power amplifier of claim 3, wherein the blind made connector is a snap in connector and wherein the tab is a copper piece soldered directly to two of the splitter, the combiner, and the final stage.

5. The RF power amplifier of claim 3, wherein key RF components of the splitter, the combiner, and the final stage interface without use of coaxial cables.

6. The RF power amplifier of claim 1, wherein the final stage interconnects directly to the motherboard PCB for control functions and auxiliary power supplies.

7. The RF power amplifier of claim 6, further comprising a serial bus to interconnect the final stage and the motherboard PCB for control functions.

8. The RF power amplifier of claim 1, wherein a carrier of the final stage shields the power rail.

9. The RF power amplifier of claim 8, wherein the carrier of the final stage and the heat sink serve as a ground that substantially surrounds the power rail, thus eliminating a need for EMI filters.

10. The RF power amplifier of claim 1, wherein the RF amplifier is operable over a range of powers and frequencies.

11. The RF power amplifier of claim 10, wherein the power range is approximately up to 2 kW pulse and 1 kW continuous wave.

12. The RF power amplifier of claim 10, wherein the frequency range extends to approximately 6 GHz.

13. An RF power amplifier architecture comprising:
(a) a motherboard printed circuit board (PCB), the motherboard PCB including electrical components for at least a splitter of the RF power amplifier;
(b) a heat sink defining a base of the RF power amplifier, the heat sink including a groove, wherein the electrical components of the splitter and electrical components of a controller fit within the groove, and wherein the heat sink serves as an EMI shield for RF and spurious emissions;
(c) wherein the RF power amplifier architecture is scalable and configurable without substantial design changes for RF power amplifiers over a range of frequencies and power levels, and
(d) a power rail to distribute a DC voltage to a final stage, wherein a power rail groove of the heat sink shields the power rail.

14. The RF power amplifier architecture of claim 13, wherein the groove comprises at least two grooves, wherein the electrical components of the splitter fit within one of the grooves, and wherein the electrical components of the controller fit within the other of the grooves.

15. The RF power amplifier architecture of claim 13, wherein the motherboard PCB includes a first PCB and a second PCB, wherein the first PCB includes the splitter, and wherein the second PCB includes the controller and signal circuits.

16. The RF power amplifier architecture of claim 13, wherein the final stage interconnects directly to the motherboard PCB for control functions and auxiliary power supplies, and wherein RF components of the splitter, a combiner, and the final stage interface without use of coaxial cables.

17. The RF power amplifier architecture of claim 13, wherein a carrier of the final stage shields the power rail.

18. The RF power amplifier architecture of claim 17, wherein the carrier of the final stage and the heat sink serve as a ground that substantially surrounds the power rail, thus eliminating a need for EMI filters.

19. An RF power amplifier architecture comprising:
(a) a controller, a driver, a splitter, a final stage, and a combiner coupled together to function as the RF power amplifier;
(b) a motherboard printed circuit board (PCB), the motherboard PCB including electrical components for at least the splitter;
(c) a heat sink defining a base of the RF power amplifier, the heat sink including a groove, wherein the electrical components of the splitter and electrical components of a controller fit within the groove, and wherein the heat sink serves as an EMI shield for RF and spurious emissions; and
(d) a power rail to distribute a DC voltage to the final stage, wherein a power rail groove of the heat sink and a carrier of the final stage shield the power rail.

20. The RF power amplifier architecture of claim 19, wherein the RF amplifier architecture is scalable and configurable without substantial design changes over a range of frequencies and power levels.

21. The RF power amplifier architecture of claim 19, wherein RF components of the splitter, the combiner, and the final stage interface using at least one of a blind made connector and a tab, thereby eliminating RF losses.

* * * * *